(12) United States Patent
Cen et al.

(10) Patent No.: US 12,721,123 B2
(45) Date of Patent: Aug. 25, 2026

(54) INTEGRATION SOLUTION FOR NAND DEEP CONTACT GAP FILL

(71) Applicant: Applied Materials, Inc., Santa Clara, CA (US)

(72) Inventors: Xi Cen, San Jose, CA (US); Kai Wu, Palo Alto, CA (US); Yao Xu, Santa Clara, CA (US); Yang Li, Sunnyvale, CA (US); Meng Zhu, Santa Clara, CA (US); Insu Ha, San Jose, CA (US); Jianqiu Guo, San Jose, CA (US); Chao Li, Santa Clara, CA (US); Rongjun Wang, Dublin, CA (US); Xianmin Tang, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 401 days.

(21) Appl. No.: 18/419,526

(22) Filed: Jan. 22, 2024

(65) Prior Publication Data

US 2024/0282631 A1 Aug. 22, 2024

Related U.S. Application Data

(60) Provisional application No. 63/447,037, filed on Feb. 20, 2023.

(51) Int. Cl.

*H10W 20/00* (2026.01)
*H10P 14/40* (2026.01)
*H10P 70/00* (2026.01)

(52) U.S. Cl.

CPC ......... *H10W 20/057* (2026.01); *H10P 14/418* (2026.01); *H10P 70/27* (2026.01); *H10W 20/033* (2026.01)

(58) Field of Classification Search

CPC ............. H10W 20/057; H10W 20/033; H10W 20/045; H10W 20/081; H10P 14/418; H10P 70/27; H10P 70/234

See application file for complete search history.

(56) References Cited

U.S. PATENT DOCUMENTS

| | | | |
|---|---|---|---|
| 2009/0053893 A1 | 2/2009 | Khandelwal et al. |
| 2013/0302980 A1 | 11/2013 | Chandrashekar et al. |
| 2019/0280003 A1 | 9/2019 | Mushiga et al. |
| 2021/0193511 A1 | 6/2021 | Wang et al. |
| 2021/0351032 A1 | 11/2021 | Cen et al. |

OTHER PUBLICATIONS

International Search Report and Written Opinion dated May 7, 2024 for Application No. PCT/US2024/012313.

*Primary Examiner* — Elias Ullah

(74) *Attorney, Agent, or Firm* — Patterson + Sheridan, LLP

(57) ABSTRACT

A method of filling a via having a necking point includes performing a pre-clean process to remove residues from an exposed surface of a metal layer at a bottom of a via and recover inner surfaces of the via, wherein the via is formed within a dielectric layer and has a necking point protruding within the via, performing a selective deposition process to partially fill the via with metal fill material from the exposed surface of the metal layer below the necking point, performing a liner deposition process to form a liner layer on exposed inner surfaces of the via, and performing a metal fill process to fill the via with the metal fill material.

20 Claims, 10 Drawing Sheets

200
212
218
214
208
602
216
220
402
204
202
206
$L_2$
$L_1$

INTEGRATION SOLUTION FOR NAND DEEP CONTACT GAP FILL

CROSS-REFERENCE TO RELATED APPLICATIONS

This application claims priority to U.S. Provisional Application Ser. No. 63/447,037 filed Feb. 20, 2023, which is herein incorporated by reference in its entirety.

BACKGROUND

Field

Embodiments herein are directed to methods used in electronic device manufacturing, and more particularly, to a process for high quality tungsten (W) filling of deep contact gaps in NAND devices.

Description of the Related Art

Tungsten (W) is widely used in integrated circuit (IC) device manufacturing to form conductive features where relatively low electrical resistance and relativity high resistance to electromigration are desired. For example, tungsten may be used as a metal fill material to form source contacts, drain contacts, metal gate fill, gate contacts, interconnects (e.g., horizontal features formed in a surface of a dielectric material layer), and vias (e.g., vertical features formed through a dielectric material layer to connect other interconnect features disposed there above and there below). Due to its relativity low resistivity, tungsten is also commonly used to form interconnects at M0 level of IC devices, and also bit lines and word lines used to address individual memory cells in a memory cell array of a three-dimensional NAND (3D NAND) device.

In future generations of NAND devices, a metal contact structure will move from one-tier tapered structure to multi-tier structure with a landing pad. Conventional deposition process, such as chemical vapor deposition (CVD), has shown to have challenges to fill deep contact gaps, such as the multi-tier structures with a landing pad, with tungsten, forming voids or seams in the filled tungsten.

Therefore, there is a need for a process that can fill deep contact gaps in NAND devices with tungsten (W) to form high quality interconnects.

SUMMARY

Embodiments of the present disclosure provide a method of filling a via having a necking point. The method includes performing a pre-clean process to remove residues from an exposed surface of a metal layer at a bottom of a via and recover inner surfaces of the via, wherein the via is formed within a dielectric layer and has a necking point protruding within the via, performing a selective deposition process to partially fill the via with metal fill material from the exposed surface of the metal layer below the necking point, performing a liner deposition process to form a liner layer on exposed inner surfaces of the via, and performing a metal fill process to fill the via with the metal fill material.

Embodiments of the present disclosure provide a method of filling a via having a necking point. The method includes performing a liner deposition process to form a liner layer on exposed inner surface of a via, wherein the via is formed within a dielectric layer and has a necking point protruding within the via, performing a liner pull back process to remove the liner layer above the necking point, performing a selective deposition process to partially fill the via with metal fill material from exposed surface of the liner layer below the necking point, and performing a metal fill process to fill the via with the metal fill material.

Embodiments of the present disclosure provide a method of filling a via having a necking point. The method includes performing a liner deposition process to form a liner layer on exposed inner surface of a via, wherein the via is formed within a dielectric layer and has a necking point protruding within the via, performing a liner pull back process to remove the liner layer above the necking point, performing a selective deposition process to partially fill the via with metal fill material from exposed surface of the liner layer below the necking point, and performing a metal fill process to fill the via with the metal fill material.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments of the disclosure and are therefore not to be considered limiting of its scope, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments herein are directed to methods used in electronic device manufacturing, and more particularly, to a process for high quality tungsten (W) filling of deep contact gaps in NAND devices.

The methods disclosed herein include filling a high aspect ratio via having a necking point with tungsten (W), starting with selective deposition of tungsten (W) to fill the via from the bottom surface (e.g., tungsten (W), titanium nitride (TiN)) of the via below the necking point, and finishing with metal fill of tungsten (W) to fill the remainder of the via. In the selective deposition, the via is filled with tungsten (W) in a bottom-up fashion from the bottom surface of the via without forming any voids or seams within the metal fill material.

Processing System Example

Figure 1:
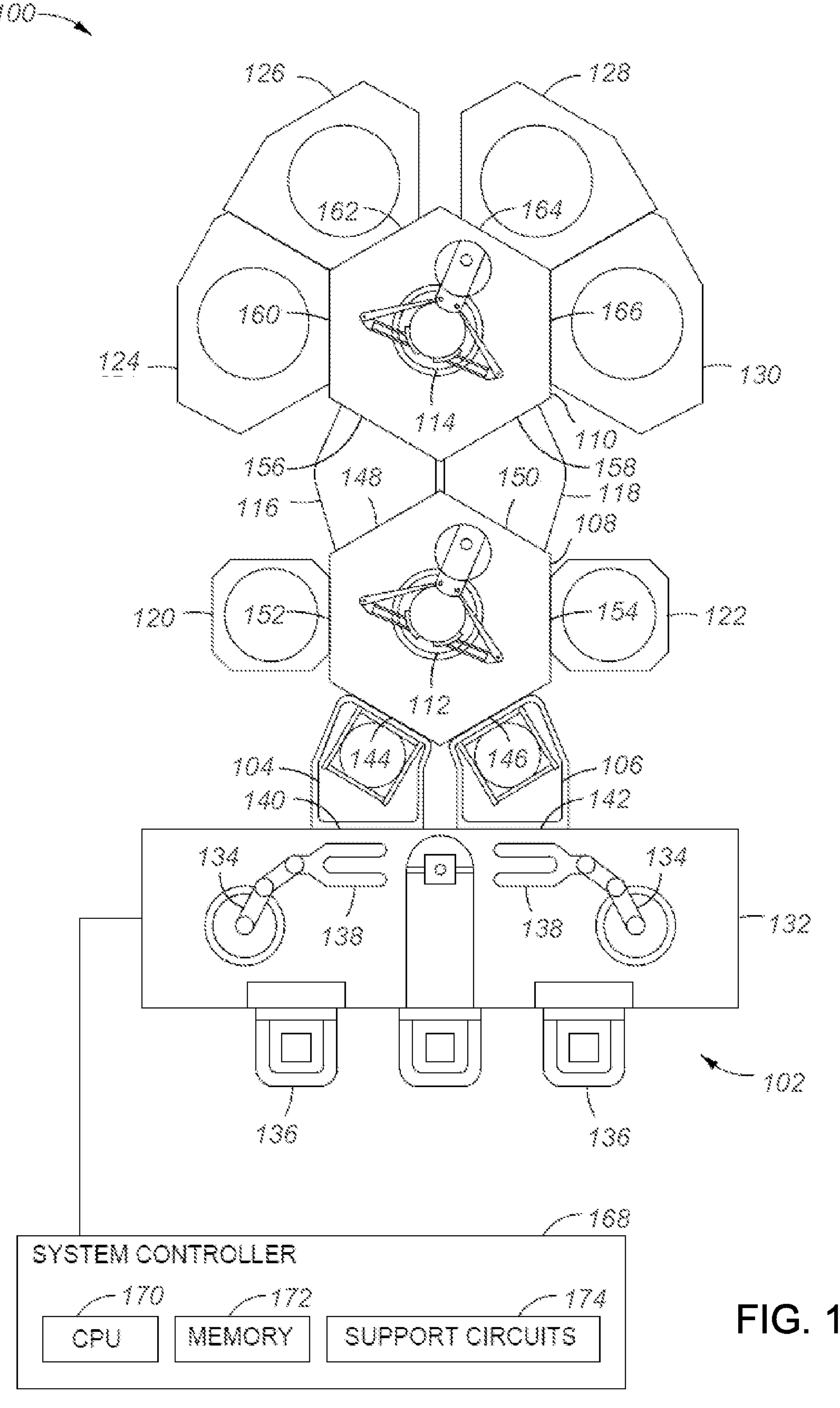
FIG. 1 is a schematic top view of a multi-chamber processing system 100, according to one or more embodiments of the present disclosure.

FIG. 1 is a schematic top view of a multi-chamber processing system 100, according to one or more embodiments of the present disclosure. The processing system 100 generally includes a factory interface 102, load lock chambers 104, 106, transfer chambers 108, 110 with respective transfer robots 112, 114, holding chambers 116, 118, and processing chambers 120, 122, 124, 126, 128, 130. As detailed herein, substrates in the processing system 100 can be processed in and transferred between the various chambers without exposing the substrates to an ambient environment exterior to the processing system 100 (e.g., an atmospheric ambient environment such as may be present in a fab). For example, the substrates can be processed in and transferred between the various chambers maintained at a low pressure (e.g., less than or equal to about 300 Torr) or vacuum environment without breaking the low pressure or vacuum environment among various processes performed on the substrates in the processing system 100. Accordingly, the processing system 100 may provide for an integrated solution for some processing of substrates.

In the illustrated example of FIG. 1, the factory interface 102 includes a docking station 132 and factory interface robots 134 to facilitate transfer of substrates. The docking station 132 is adapted to accept one or more front opening unified pods (FOUPs) 136. In some examples, each factory interface robot 134 generally includes a blade 138 disposed on one end of the respective factory interface robot 134 adapted to transfer the substrates from the factory interface 102 to the load lock chambers 104, 106.

The load lock chambers 104, 106 have respective ports 140, 142 coupled to the factory interface 102 and respective ports 144, 146 coupled to the transfer chamber 108. The transfer chamber 108 further has respective ports 148, 150 coupled to the holding chambers 116, 118 and respective ports 152, 154 coupled to processing chambers 120, 122. Similarly, the transfer chamber 110 has respective ports 156, 158 coupled to the holding chambers 116, 118 and respective ports 160, 162, 164, 166 coupled to processing chambers 124, 126, 128, 130. The ports 144, 146, 148, 150, 152, 154, 156, 158, 160, 162, 164, 166 can be, for example, slit valve openings with slit valves for passing substrates therethrough by the transfer robots 112, 114 and for providing a seal between respective chambers to prevent a gas from passing between the respective chambers. Generally, any port is open for transferring a substrate therethrough. Otherwise, the port is closed.

The load lock chambers 104, 106, transfer chambers 108, 110, holding chambers 116, 118, and processing chambers 120, 122, 124, 126, 128, 130 may be fluidly coupled to a gas and pressure control system (not specifically illustrated). The gas and pressure control system can include one or more gas pumps (e.g., turbo pumps, cryo-pumps, roughing pumps), gas sources, various valves, and conduits fluidly coupled to the various chambers. In operation, a factory interface robot 134 transfers a substrate from a FOUP 136 through a port 140 or 142 to a load lock chamber 104 or 106. The gas and pressure control system then pumps down the load lock chamber 104 or 106. The gas and pressure control system further maintains the transfer chambers 108, 110 and holding chambers 116, 118 with an interior low pressure or vacuum environment (which may include an inert gas). Hence, the pumping down of the load lock chamber 104 or 106 facilitates passing the substrate between, for example, the atmospheric environment of the factory interface 102 and the low pressure or vacuum environment of the transfer chamber 108.

With the substrate in the load lock chamber 104 or 106 that has been pumped down, the transfer robot 112 transfers the substrate from the load lock chamber 104 or 106 into the transfer chamber 108 through the port 144 or 146. The transfer robot 112 is then capable of transferring the substrate to and/or between any of the processing chambers 120, 122 through the respective ports 152, 154 for processing and the holding chambers 116, 118 through the respective ports 148, 150 for holding to await further transfer. Similarly, the transfer robot 114 is capable of accessing the substrate in the holding chamber 116 or 118 through the port 156 or 158 and is capable of transferring the substrate to and/or between any of the processing chambers 124, 126, 128, 130 through the respective ports 160, 162, 164, 166 for processing and the holding chambers 116, 118 through the respective ports 156, 158 for holding to await further transfer. The transfer and holding of the substrate within and among the various chambers can be in the low pressure or vacuum environment provided by the gas and pressure control system.

The processing chambers 120, 122, 124, 126, 128, 130 can be any appropriate chamber for processing a substrate. In some examples, the processing chamber 120 can be capable of performing an etch process, the processing chamber 122 can be capable of performing a cleaning process, and the processing chambers 126, 128, 130 can be capable of performing respective epitaxial growth processes.

A system controller 168 is coupled to the processing system 100 for controlling the processing system 100 or components thereof. For example, the system controller 168 may control the operation of the processing system 100 using a direct control of the chambers 104, 106, 108, 110, 116, 118, 120, 122, 124, 126, 128, 130 of the processing system 100 or by controlling controllers associated with the chambers 104, 106, 108, 110, 116, 118, 120, 122, 124, 126, 128, 130. In operation, the system controller 168 enables data collection and feedback from the respective chambers to coordinate performance of the processing system 100.

The system controller 168 generally includes a central processing unit (CPU) 170, memory 172, and support circuits 174. The CPU 170 may be one of any form of a general-purpose processor that can be used in an industrial setting. The memory 172, or non-transitory computer-readable medium, is accessible by the CPU 170 and may be one or more of memory such as random access memory (RAM), read only memory (ROM), floppy disk, hard disk, or any other form of digital storage, local or remote. The support circuits 174 are coupled to the CPU 170 and may comprise cache, clock circuits, input/output subsystems, power supplies, and the like. The various methods disclosed herein may generally be implemented under the control of the CPU 170 by the CPU 170 executing computer instruction code stored in the memory 172 (or in memory of a particular processing chamber) as, for example, a software routine. When the computer instruction code is executed by the CPU 170, the CPU 170 controls the chambers to perform processes in accordance with the various methods.

Other processing systems can be in other configurations. For example, more or fewer processing chambers may be coupled to a transfer apparatus. In the illustrated example, the transfer apparatus includes the transfer chambers 108, 110 and the holding chambers 116, 118. In other examples, more or fewer transfer chambers (e.g., one transfer chamber) and/or more or fewer holding chambers (e.g., no holding chambers) may be implemented as a transfer apparatus in a processing system.

Example Semiconductor Structure

Figures 2, 3:
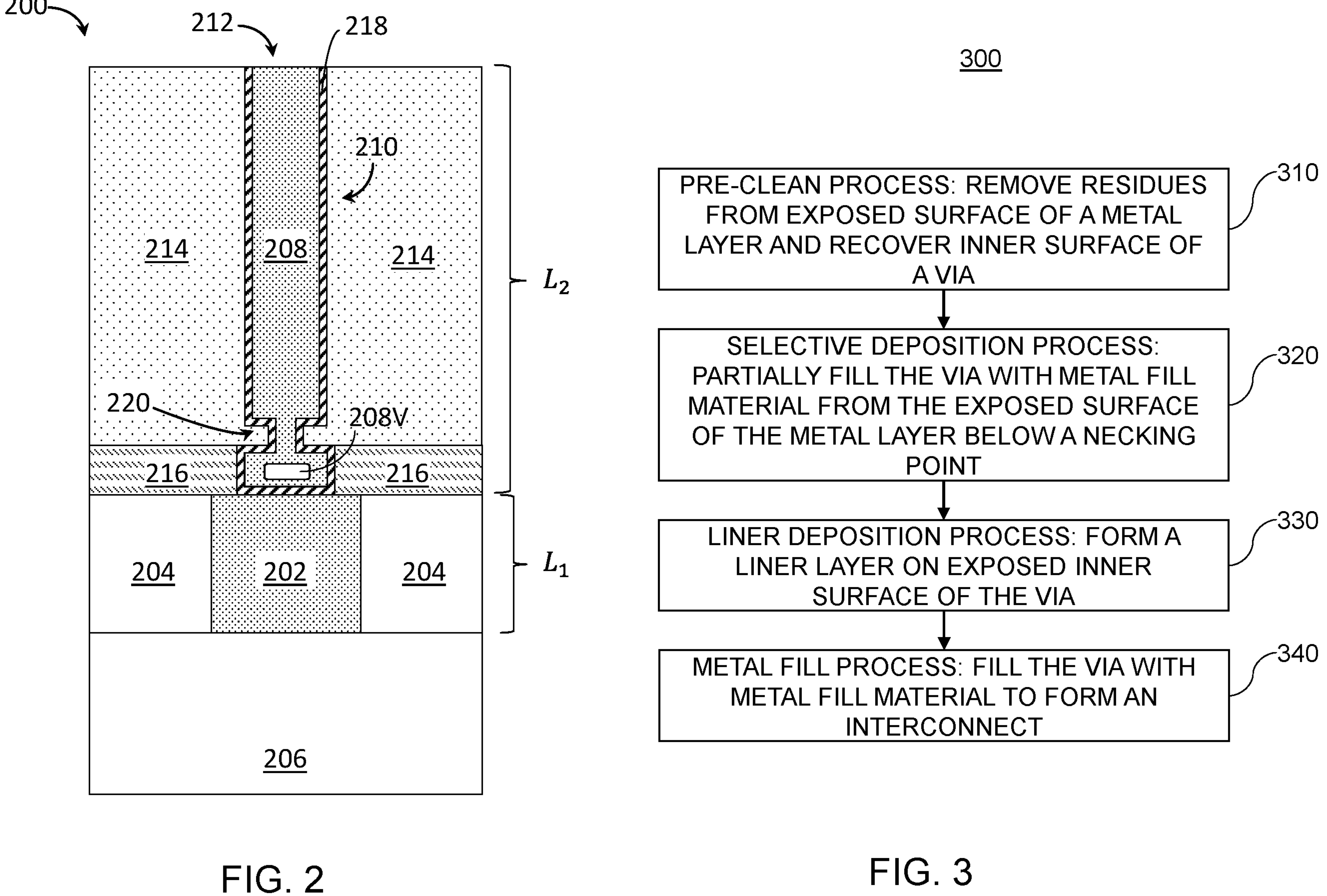
FIG. 2 is a schematic view of a middle-end-of-line (MEOL) portion of an exemplary semiconductor structure, according to one or more embodiments of the present disclosure.
FIG. 3 depicts a process flow diagram of a method of filling a via of a landing pad structure in a semiconductor structure, according to a first embodiment of the present disclosure.

FIG. 2 is a schematic view of an exemplary semiconductor structure 200 that may be a three-dimensional NAND (3D NAND) device having a metal contact.

The semiconductor structure 200 may include a first level $L_1$ that includes a metal layer 202 within a first dielectric layer 204 formed on a substrate 206, and a second level $L_2$ that includes an interconnect 208 within a landing pad 210 having a via 212 formed within a stack of a second dielectric layer 214 and a third dielectric layer 216 formed on the second level $L_2$. Within the landing pad 210, a liner layer 218 may be formed around the interconnect 208. The via 212 may have a width of between about 160 nm and about 240 nm and a depth of between about 5 μm and about 20 μm. The landing pad 210 may have a necking point 220 near the interface between the second dielectric layer 214 and the third dielectric layer 216 due to etching through the second dielectric layer 214 and the third dielectric layer 216 to form the via 212. The necking point 220 may protrude within the via 212 by between about 100 nm and about 120 nm. The third dielectric layer 216 may have a thickness of between about 800 nm and about 1.2 μm. The interconnect 208, formed within the via 212, may have a void 208V below the necking point 220, when formed by conventional deposition process, such as chemical vapor deposition (CVD).

The term "substrate" as used herein refers to a layer of material that serves as a basis for subsequent processing operations and includes a surface to be cleaned. The substrate 206 may be a silicon based material or any suitable insulating materials or conductive materials as needed. The substrate 206 may include a material such as crystalline silicon (e.g., Si<100> or Si<111>), silicon oxide, strained silicon, silicon germanium, doped or undoped polysilicon, doped or undoped silicon wafers and patterned or non-patterned wafers, silicon on insulator (SOI), carbon doped silicon oxides, silicon nitride, doped silicon, germanium, gallium arsenide, glass, or sapphire.

The metal layer 202 and the interconnect 208 may be formed of tungsten (W), tungsten carbide (WC), tungsten nitride (WN), or molybdenum (Mo).

The first dielectric layer 204, the second dielectric layer 214, and the third dielectric layer 216 may be each formed of dielectric material such as silicon oxide ($SiO_2$), or silicon nitride ($Si_3N_4$).

The liner layer 218 may be formed of titanium nitride (TiN) or tungsten (W).

Metal Filling

FIG. 3 depicts a process flow diagram of a method 300 of filling a via of a landing pad structure in a semiconductor structure, such as the semiconductor structure 200 as shown in FIG. 2, according to a first embodiment of the present disclosure. FIGS. 4A, 4B, 4C, and 4D are cross-sectional views of the semiconductor structure 200 corresponding to various states of the method 300. It should be understood that FIGS. 4A, 4B, 4C, and 4D illustrate only partial schematic views of the semiconductor structure 200, and the semiconductor structure 200 may contain any number of transistor sections and additional materials having aspects as illustrated in the figures. It should also be noted that although the method illustrated in FIG. 3 is described sequentially, other process sequences that include one or more operations that have been omitted and/or added, and/or has been rearranged in another desirable order, fall within the scope of the embodiments of the disclosure provided herein.

Figure 4B:
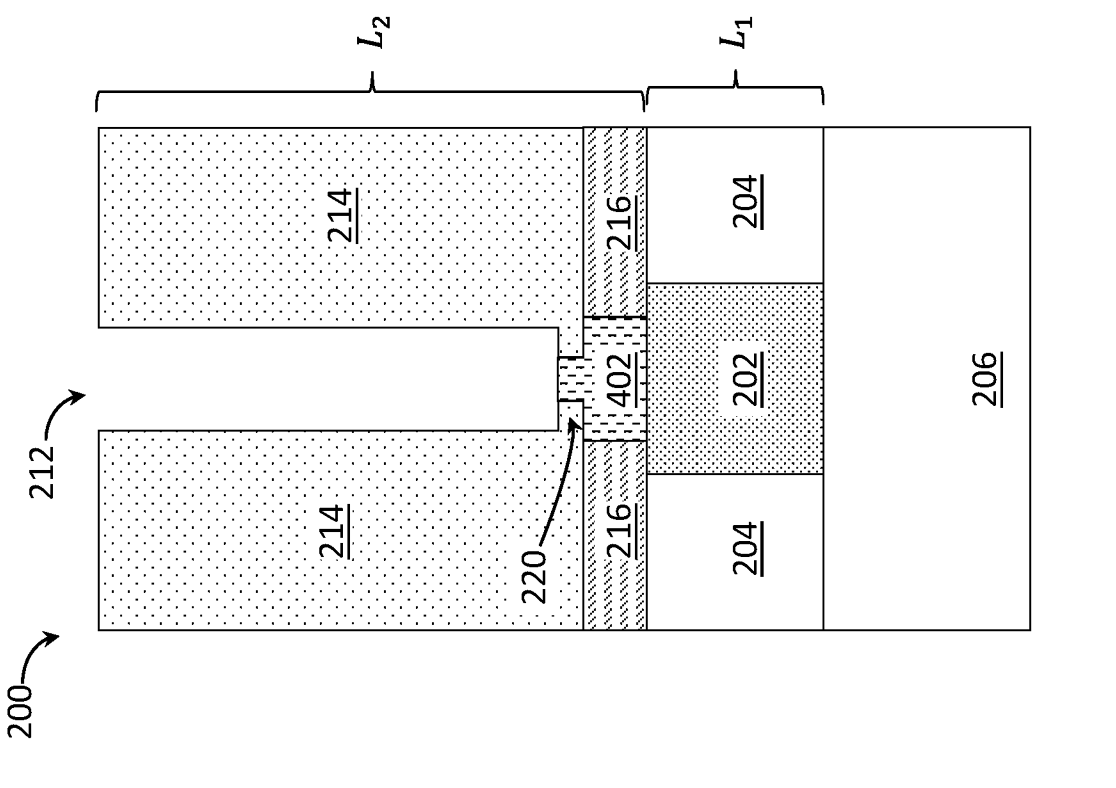
FIGS. 4A, 4B, 4C, and 4D are cross-sectional views of a portion of the semiconductor structure corresponding to various states of the method of FIG. 3.
Figure 4A:
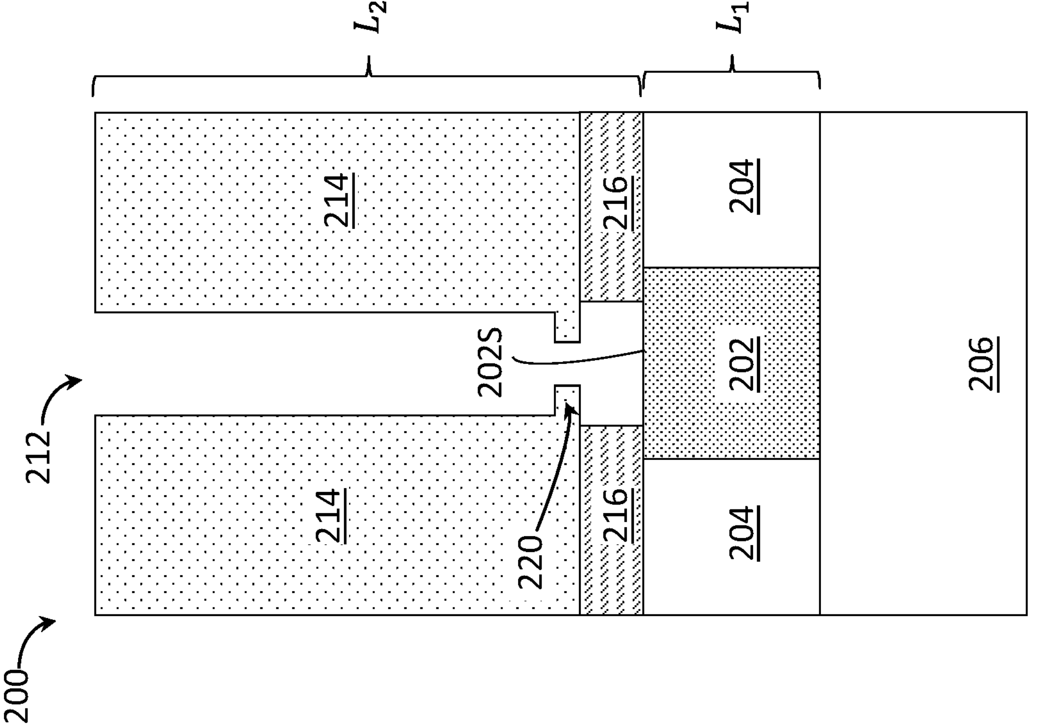

As shown in FIG. 4A, the semiconductor structure 200 includes a first level $L_1$ that includes a metal layer 202 within a first dielectric layer 204 formed on a substrate 206, and a second level $L_2$ that includes a stack of a second dielectric layer 214 and a third dielectric layer 216, having a via 212 formed therein on the first level $L_1$. At a bottom of the via 212, a surface 202S of the metal layer 202 is exposed. An interconnect 208 (not shown in FIG. 4A) will be formed within the via 212.

Near the interface between the second dielectric layer 214 and the third dielectric layer 216, a necking point 220 is formed within the via 212 due to etching through the second dielectric layer 214 and the third dielectric layer 216 to form the via 212. The via 212 may have a width of between about 160 nm and about 240 nm and a depth of between about 5 μm and about 20 μm. The necking point 220 may protrude within the via 212 by between about 100 nm and about 120 nm at a height from the bottom of the via (corresponding to a thickness of the third dielectric layer 216) of between about 250 nm and about 300 nm.

The metal layer 202 and the interconnect 208 may be formed of tungsten (W) or molybdenum (Mo). The first dielectric layer 204, the second dielectric layer 214, and the third dielectric layer 216 may be each formed of dielectric material such as silicon oxide ($SiO_2$) or silicon nitride ($Si_3N_4$).

The method 300 begins with block 310, in which a pre-clean process is performed to remove residues from the exposed surface 202S of the metal layer 202 and recover inner surfaces of the via 212 (e.g., exposed surfaces of the second dielectric layer 214 and the third dielectric layer 216 within the via 212).

During the fabrication of the second level $L_2$, the semiconductor structure 200 may be exposed to air or other oxidizing environment, and thus the surface 202S of the metal layer 202 may be oxidized. Further, an etching process to form the via 212 within the stack of the second dielectric layer 214 and the third dielectric layer 216 may also leave residues, such as chlorine residues or fluorine residues, on the surface 202S of the metal layer 202 or damage surfaces of the second dielectric layer 214 and the third dielectric layer 216 within the via 212. The surface 202S of the metal layer 202, the surfaces of the second dielectric layer 214 and the third dielectric layer 216 within the via 212 are therefore pre-cleaned prior to filling the via 212 from a bottom surface of the via 212 (the surface 202S of the metal layer 202) to form the interconnect 208.

The pre-clean process may include a chemical soak process to selectively remove metal oxides (e.g., tungsten oxide ($WO_x$)) from the surface 202S of the metal layer 202, in which the surface 202S of the metal layer 202 is soaked in a precursor (e.g., tungsten fluoride ($WF_6$), hydrogen ($H_2$)) that is provided in a pulsing flow or a continuous flow in a CVD/ALD processing chamber, such as the processing chamber 124, 126, 128, or 130 shown in FIG. 1. The pre-clean process to selectively remove metal oxides (e.g., tungsten oxide ($WO_x$)) from the surface 202S of the metal layer 202 may be a plasma process using a plasma formed from a process gas including hydrogen ($H_2$)-containing gas. The plasma process may be an inductively coupled plasma (ICP) process, performed in a processing chamber, such as the processing chamber 124, 126, 128, or 130 shown in FIG. 1, or a capacitively coupled plasma (CCP) process performed in a processing chamber, such as the processing chamber 124, 126, 128, or 130 shown in FIG. 1.

The pre-clean process to recover exposed surfaces of the second dielectric layer 214 and the third dielectric layer 216 within the via 212 may include a plasma treatment process using a plasma formed from a process gas including oxygen ($O_2$)-containing gas. The plasma treatment process may be a capacitively coupled plasma (CCP) process performed in a processing chamber, such as the processing chamber 124, 126, 128, or 130 shown in FIG. 1. The plasma treatment process may be an inductively coupled plasma (ICP) process performed in a processing chamber, such as the processing chamber 124, 126, 128, or 130 shown in FIG. 1.

In block 320, a selective deposition process is performed to partially fill the via 212 with metal fill material 402 from the exposed surface 202S of the metal layer 202 below the necking point 220, as shown in FIG. 4B. The metal fill material 402 may be tungsten (W) or molybdenum (Mo).

In the selective deposition process, the metal fill material 402 grows selectively on the exposed surface 202S of the metal layer 202 and not on sidewalls of the via 212 (e.g., silicon nitride ($Si_3N_4$) or silicon oxide ($SiO_2$))), and thus the via 212 is filled with metal fill material 402 in a bottom-up fashion from the bottom surface 202S of the via 212, without forming any voids or seams within the metal fill material 402.

The selective deposition process may include a chemical vapor deposition (CVD) process using a tungsten (W)-containing precursor, such as tungsten hexafluoride ($WF_6$) and hydrogen ($H_2$), in a processing chamber, such as the processing chamber 126 shown in FIG. 1. A flow rate ratio of the tungsten (W)-containing precursor to the hydrogen ($H_2$)-containing carrier gas may be between about 0.001 and about 0.007, to ensure selectivity of deposition of tungsten (W) on the metal layer 202 (e.g., tungsten (W)).

The selective deposition process is performed at a temperature of between about 300° ° C. and about 500° C.

Figure 4D:
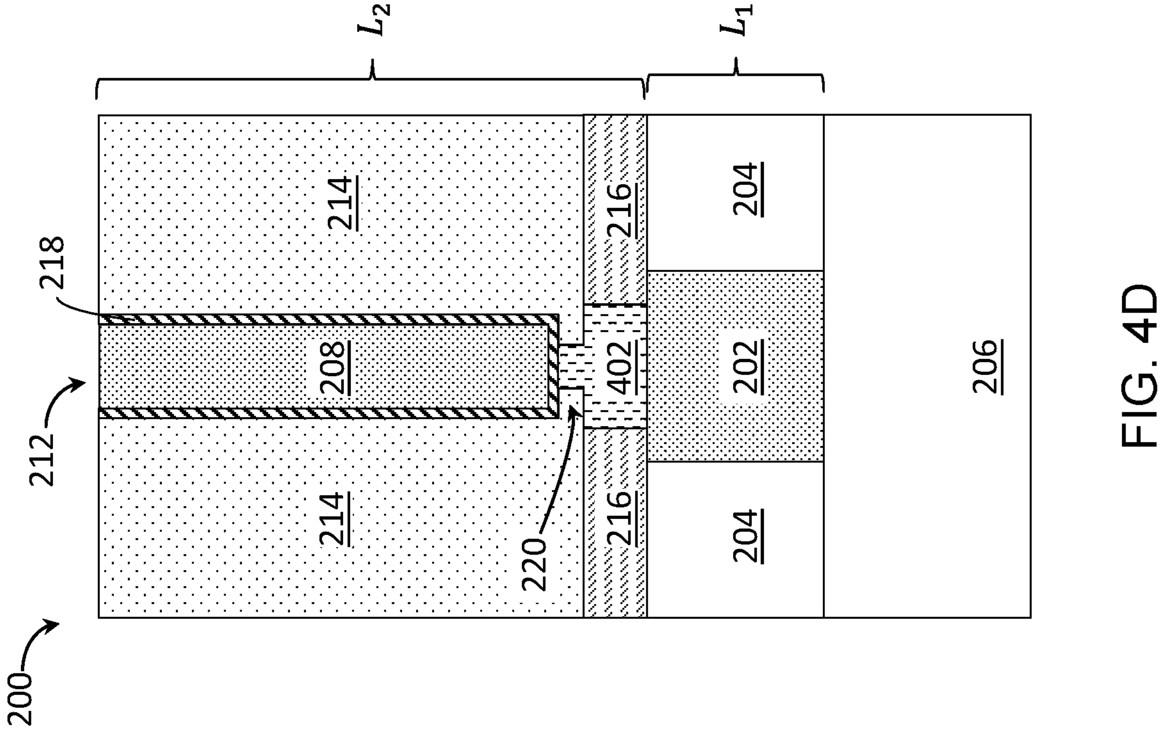
Figure 4C:
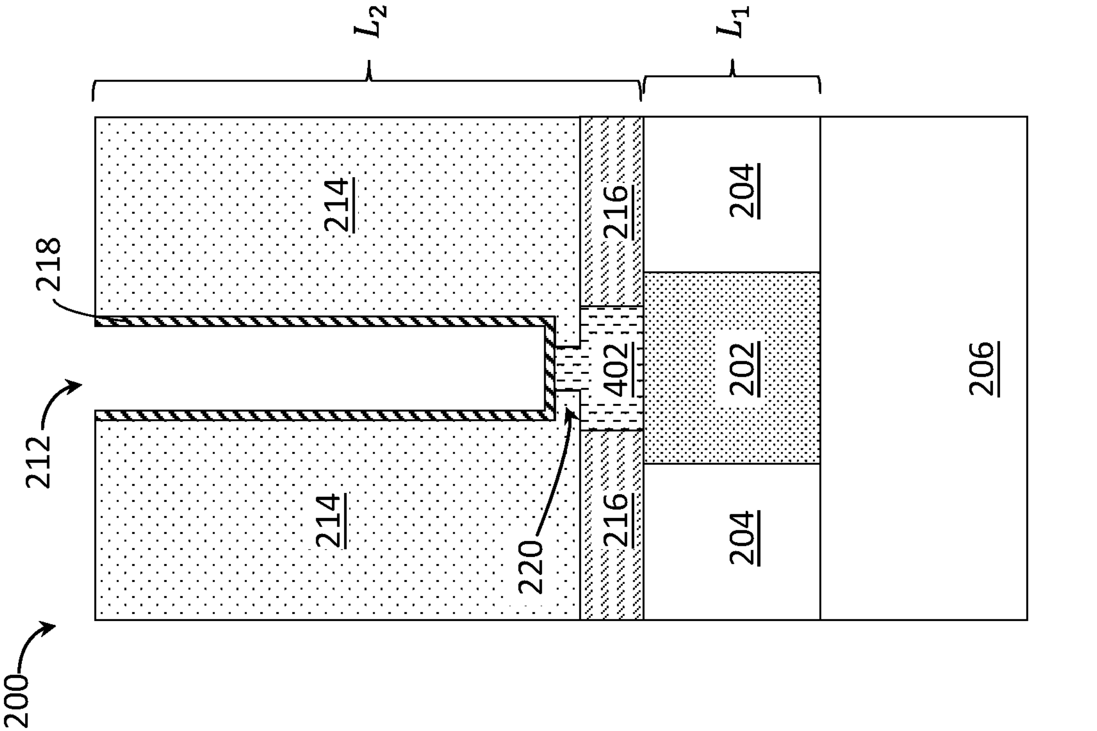

In block 330, a liner deposition process is performed to form a liner layer 218 on exposed inner surfaces of the via 212, as shown in FIG. 4C. The liner layer 218 may be formed of titanium nitride (TiN) or tantalum nitride (TaN), and serve as a nucleation layer on which metal fill material 402, such as tungsten (W), grows in the subsequent metal fill process in block 340.

The liner deposition process may include an atomic layer deposition (ALD) process performed in a processing chamber, such as the processing chamber 124, 126, 128, or 130 shown in FIG. 1, in which a metal-containing precursor including titanium (Ti) and a nitrogen-containing precursor are alternatively delivered to the semiconductor structure 200. In some embodiments, the metal-containing precursor is purged prior to delivering the nitrogen-containing precursor. Examples of the metal-containing precursor including titanium (Ti) are inorganic compounds of titanium (Ti) such as titanium chloride ($TiCl_4$), and organometallic compounds of titanium (Ti) such as tetrakis(dimethylamino)titanium (TDMAT, $[(CH_3)_2N]_4Ti$). Examples of the nitrogen-containing precursor are ammonia ($NH_3$), diazene ($N_2H_2$), and hydrazine ($N_2H_4$).

In block 340, a metal fill process is performed to fill the via 212 with metal fill material 402, such as tungsten (W), to form an interconnect 208, as shown in FIG. 4D.

In the metal fill process, the metal fill material 402 grows from the liner layer 218 deposited on the inner surfaces of the via 212. The metal fill process may include a chemical vapor deposition (CVD) process using a tungsten (W)-containing precursor, such as tungsten hexafluoride ($WF_6$) and a hydrogen ($H_2$)-containing carrier gas, in a processing chamber, such as the processing chamber 126 shown in FIG. 1.

Additionally, pulses of a nitrogen-containing gas, such as nitrogen ($N_2$) radicals, ammonia ($NH_3$), or nitrogen trifluoride ($NF_3$) may be added between depositions of tungsten (W) to suppress deposition of tungsten (W) on the field (e.g., on the second dielectric layer 214) such that tungsten (W) conformally grows from the liner layer 218 without forming seam.

The metal fill process is performed at a flow rate of the tungsten (W)-containing precursor of between about 200 sccm and 800 sccm and a flow rate of the hydrogen ($H_2$)-containing carrier gas of between about 2000 sccm and about 8000 sccm, at a temperature of between about 350° C. and about 500° C.

Figures 5, 6A:
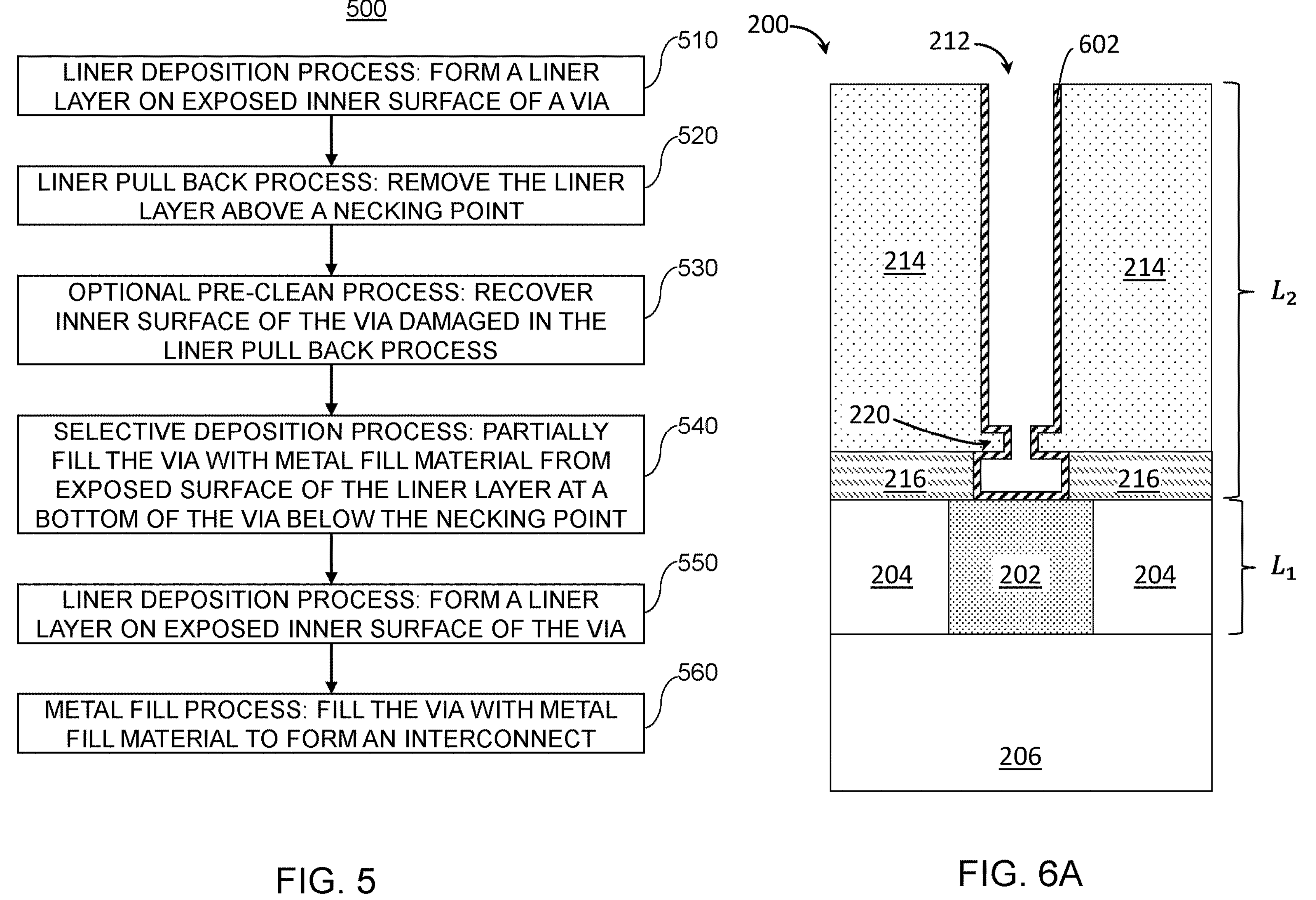
FIG. 5 depicts a process flow diagram of a method of filling a via of a landing pad structure in a semiconductor structure, according to a second embodiment of the present disclosure.
FIGS. 6A, 6B, 6C, 6D, and 6E are cross-sectional views of a portion of the semiconductor structure corresponding to various states of the method of FIG. 5.

FIG. 5 depicts a process flow diagram of a method 500 of filling a via of a landing pad structure in a semiconductor structure, such as the semiconductor structure 200 as shown in FIG. 2, according to a second embodiment of the present disclosure. The same reference numerals are used for the components that are substantially the same as those of the first embodiment, and the description of repeated components may be omitted. FIGS. 6A, 6B, 6C, 6D, and 6E are cross-sectional views of the semiconductor structure 200 corresponding to various states of the method 500. It should be understood that FIGS. 6A, 6B, 6C, 6D, and 6E illustrate only partial schematic views of the semiconductor structure 200, and the semiconductor structure 200 may contain any number of transistor sections and additional materials having aspects as illustrated in the figures. It should also be noted that although the method illustrated in FIG. 5 is described sequentially, other process sequences that include one or more operations that have been omitted and/or added, and/or has been rearranged in another desirable order, fall within the scope of the embodiments of the disclosure provided herein.

The method 500 begins with block 510, in which a liner deposition process is performed to form a liner layer 602 on exposed inner surfaces of the via 212, as shown in FIG. 6A. This liner deposition process is performed prior to a selective deposition process to fill the via 212 below the necking point 220, and thus the liner layer 602 is formed on the inner surfaces of the via 212 above and below the necking point 220. The liner layer 602 may be formed of titanium nitride (TiN) or tantalum nitride (TaN).

The liner deposition process in block 510 is similar to or the same as the liner deposition process in block 330.

Figures 6B, 6C:
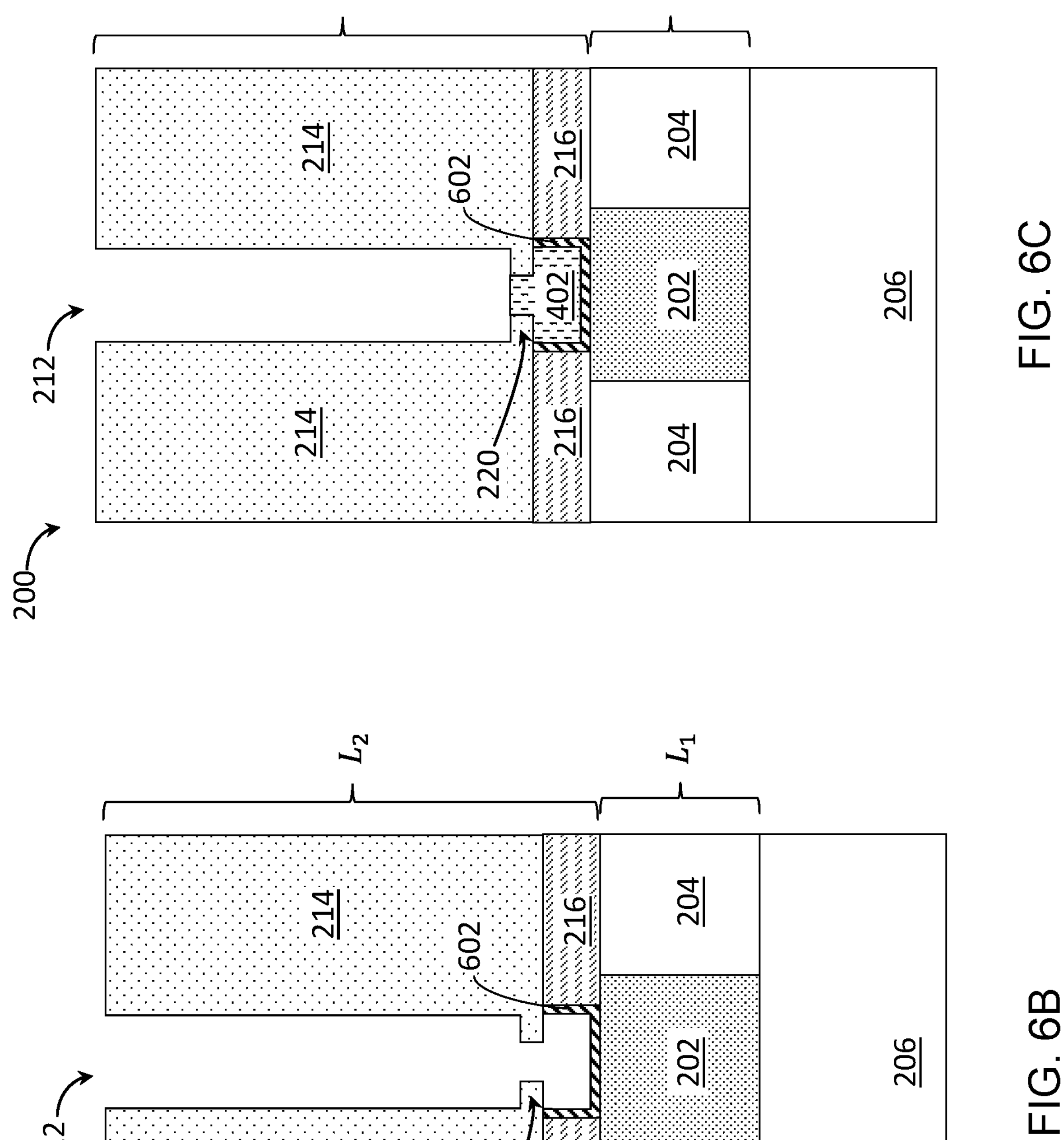

In block 520, a liner pull back process is performed to remove the liner layer 602 above the necking point 220, as shown FIG. 6B.

The liner pull back process may include a wet etch process or a dry etch process in an etch chamber, such as the processing chamber 122 shown in FIG. 1.

In block 530, an optional pre-clean process is performed to recover inner surfaces of the via 212 (e.g., exposed surfaces of the second dielectric layer 214 within the via 212) damaged in the liner pull back process in block 520. The pre-clean process in block 530 is similar to or the same as the pre-clean process in block 310.

In block 540, a selective deposition process is performed to partially fill the via 212 with metal fill material 402, such as tungsten (W), from exposed surface of the liner layer 602 at the bottom of the via 212 below the necking point 220, as shown in FIG. 6C.

In the selective deposition process, the metal fill material 402 grows selectively on the exposed surface of the liner layer 602 and not on sidewalls of the via 212 (e.g., silicon nitride ($Si_3N_4$) or silicon oxide ($SiO_2$))), and thus the via 212 below the necking point 220 is filled with metal fill material 402, without forming any voids or seams within the metal fill material 402.

The selective deposition process in block 540 is similar to or the same as the selective deposition process in block 320.

Figures 6D, 6E:
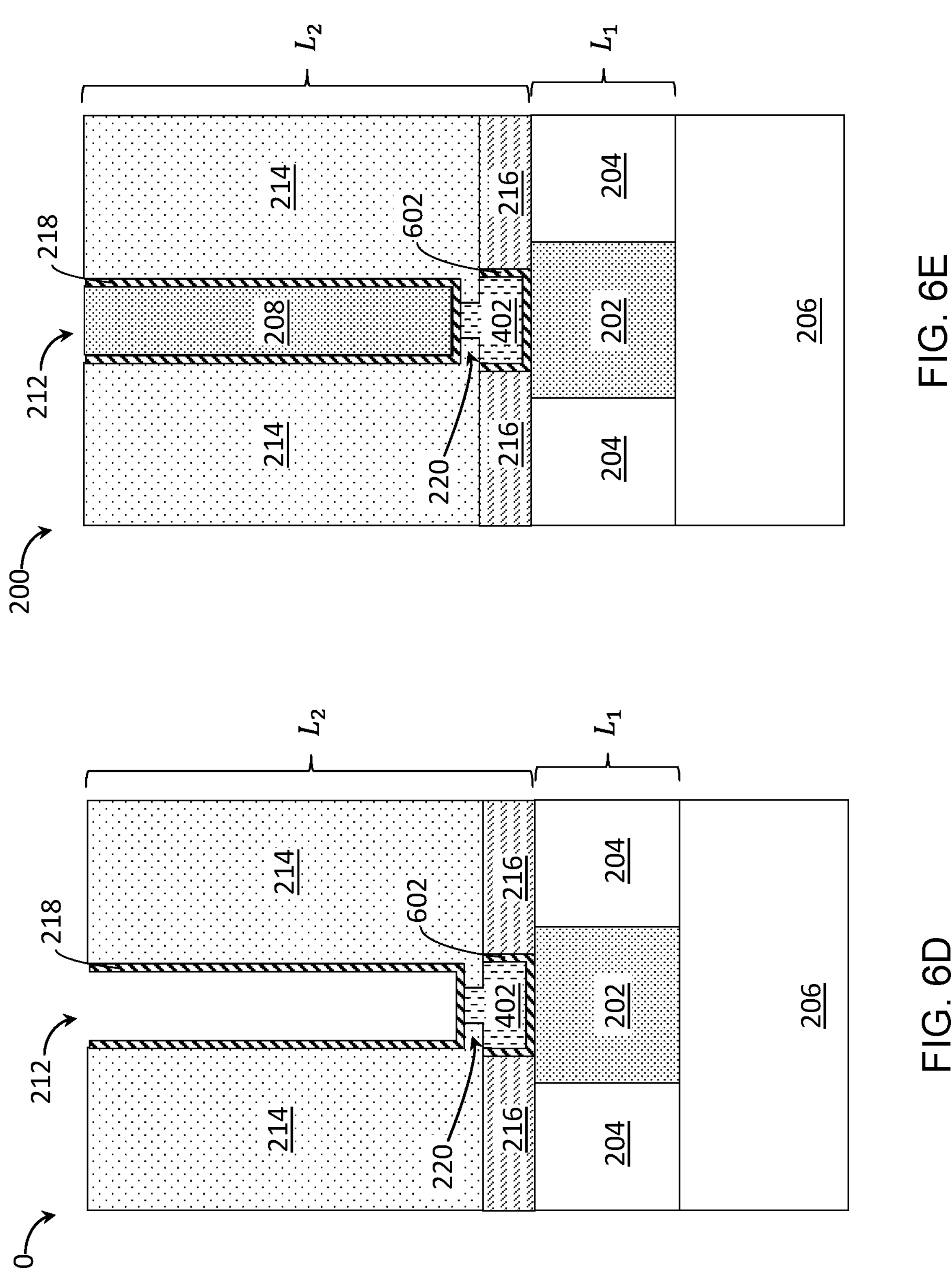

In block 550, a liner deposition process is performed to form a liner layer 218 on exposed inner surfaces of the via 212, as shown in FIG. 6D. The liner deposition process in block 550 is similar to or the same as the liner deposition process in block 330.

In block 560, a metal fill process is performed to fill the via 212 with metal fill material 402, such as tungsten (W), to form an interconnect 208, as shown in FIG. 6E. The metal fill process is similar to or the same as the metal fill process in block 340.

Figures 7, 8A:
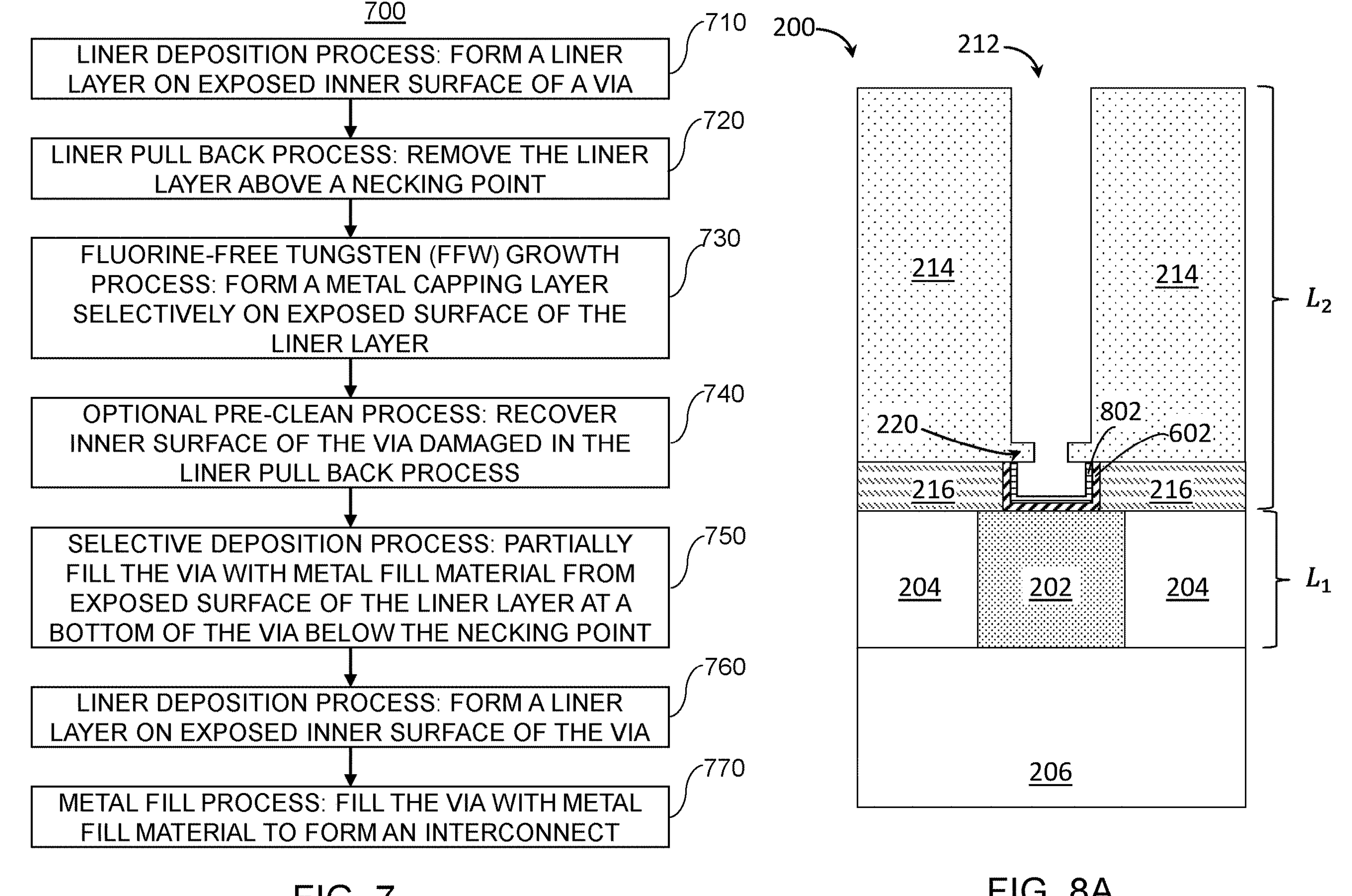
FIG. 7 depicts a process flow diagram of a method of filling a via of a landing pad structure in a semiconductor structure, according to a third embodiment of the present disclosure.
FIGS. 8A, 8B, 8C, and 8D are cross-sectional views of a portion of the semiconductor structure corresponding to various states of the method of FIG. 7.

FIG. 7 depicts a process flow diagram of a method 700 of filling a via of a landing pad structure in a semiconductor structure, such as the semiconductor structure 200 as shown in FIG. 2, according to a third embodiment of the present disclosure. The same reference numerals are used for the components that are substantially the same as those of the first embodiment and the second embodiment, and the description of repeated components may be omitted. FIGS. 8A, 8B, 8C, and 8D are cross-sectional views of the semiconductor structure 200 corresponding to various states of the method 700. It should be understood that FIGS. 8A, 8B, 8C, and 8D illustrate only partial schematic views of the semiconductor structure 200, and the semiconductor structure 200 may contain any number of transistor sections and additional materials having aspects as illustrated in the figures. It should also be noted that although the method illustrated in FIG. 7 is described sequentially, other process sequences that include one or more operations that have been omitted and/or added, and/or has been rearranged in another desirable order, fall within the scope of the embodiments of the disclosure provided herein.

The method 700 begins with block 710, in which a liner deposition process is performed to form a liner layer 602 on exposed inner surfaces of the via 212, as shown in FIG. 6A. The liner deposition process in block 710 is the same as the liner deposition process in 510.

In block 720, a liner pull back process is performed to remove the liner layer 602 above the necking point 220, as shown FIG. 6B. The liner pull back process in block 720 is the same as the liner pull back process in block 520.

In block 730, a fluorine-free tungsten (FFW) growth process is performed to form a metal capping layer 802 selectively on exposed surfaces of the liner layer 602, as shown in FIG. 8A. The metal capping layer 802 may be formed of tungsten (W) having a thickness of between about 20 Å and about 40 Å, for example, about 20 Å, and serve as a nucleation layer on which metal fill material 402, such as tungsten (W), grows in the subsequent selective deposition process in block 750.

The FFW growth process may include a chemical vapor deposition (CVD) process or an atomic layer deposition (ALD), in which the surfaces of the liner layer 602 is soaked in a precursor including tungsten chloride ($WCl_6$) gas that is provided in a pulsing flow in a processing chamber, such as the processing chamber 122 shown in FIG. 1.

In block 740, an optional pre-clean process is performed to recover inner surfaces of the via 212 (e.g., exposed surfaces of the second dielectric layer 214 within the via 212) damaged in the liner pull back process in block 720. The pre-clean process in block 740 is similar to or the same as the pre-clean process in block 310.

Figure 8C:
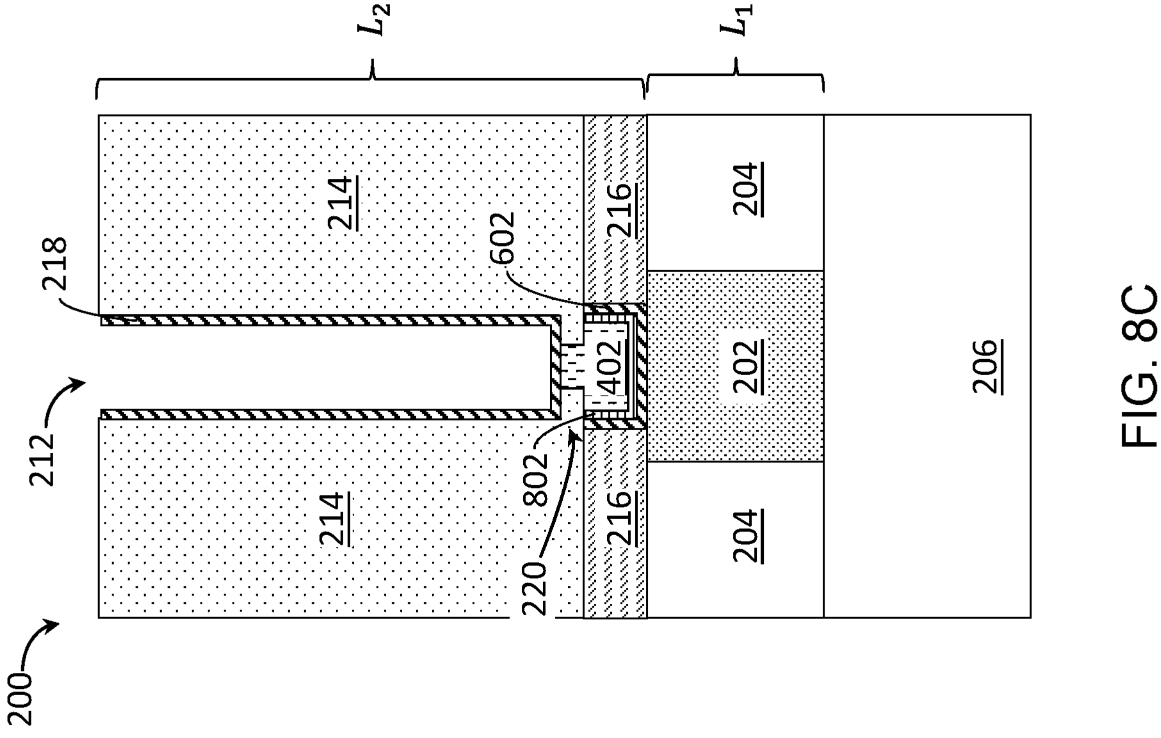
Figure 8B:
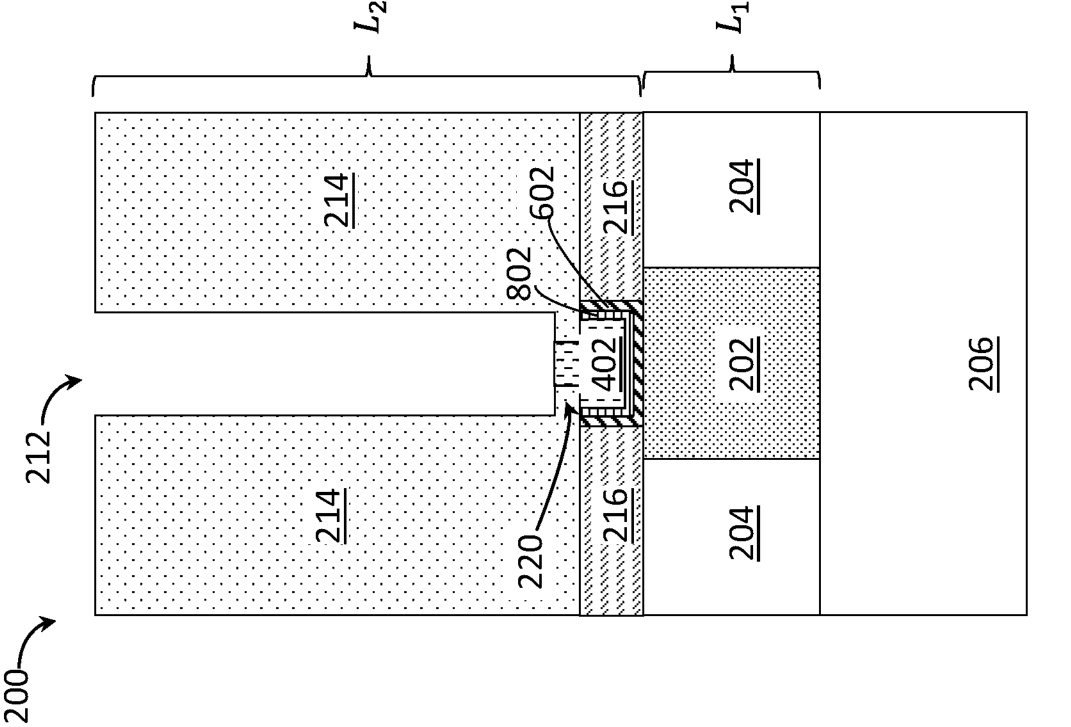

In block 750, a selective deposition process is performed to partially fill the via 212 with metal fill material 402, such as tungsten (W), from exposed surface of the metal capping layer 802 at the bottom of the via 212 below the necking point 220, as shown in FIG. 8B.

In the selective deposition process, the metal fill material 402 grows selectively on the exposed surface of the metal capping layer 802 and not on sidewalls of the via 212 (e.g., silicon nitride ($Si_3N_4$) or silicon oxide ($SiO_2$))), and thus the via 212 below the necking point 220 is filled with metal fill material 402, without forming any voids or seams within the metal fill material 402.

The selective deposition process in block 750 is similar to or the same as the selective deposition process in block 320.

In block 760, a liner deposition process is performed to form a liner layer 218 on exposed inner surfaces of the via 212, as shown in FIG. 8C. The liner deposition process in block 760 is similar to or the same as the liner deposition process in block 330.

Figure 8D:
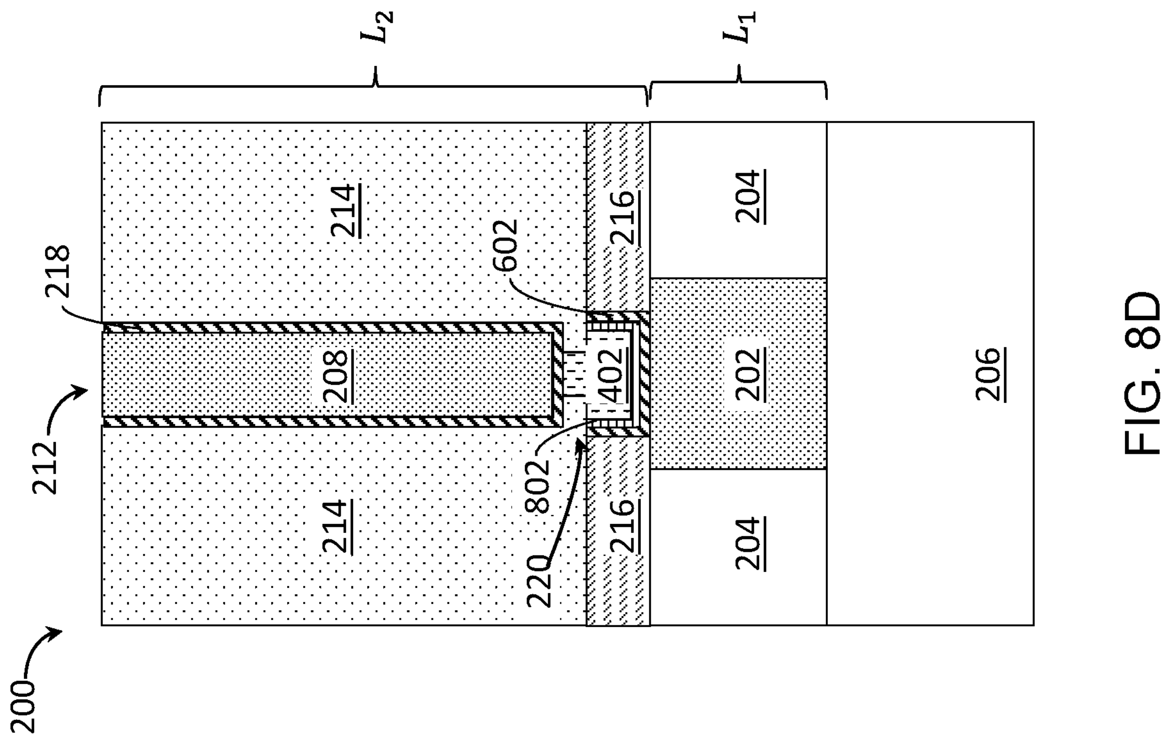

In block 770, a metal fill process is performed to fill the via 212 with metal fill material 402, such as tungsten (W), to form an interconnect 208, as shown in FIG. 8D. The metal fill process is similar to or the same as the metal fill process in block 340.

The embodiments described herein provide a system and a method used to fill a high aspect ratio via having a necking point with tungsten (W) without forming voids or seams. The method includes selective deposition of tungsten (W) to fill the via from the bottom surface (e.g., tungsten (W), titanium nitride (TiN)) of the via below the necking point, and metal fill of tungsten (W) to fill the remainder of the via. In the selective deposition, the via is filled with tungsten (W) in a bottom-up fashion from the bottom surface of the via without forming any voids or seams within the metal fill material.

While the foregoing is directed to embodiments of the present disclosure, other and further embodiments of the disclosure may be devised without departing from the basic scope thereof, and the scope thereof is determined by the claims that follow.

We claim:

1. A method of filling a via having a necking point, comprising:

performing a pre-clean process to remove residues from an exposed surface of a metal layer at a bottom of a via and recover inner surfaces of the via, wherein the via is formed within a dielectric layer and has a necking point protruding within the via;

performing a selective deposition process to partially fill the via with metal fill material from the exposed surface of the metal layer below the necking point;

performing a liner deposition process to form a liner layer on exposed inner surfaces of the via; and performing a metal fill process to fill the via with the metal fill material.

2. The method of claim 1, wherein:

the via has a width of between 160 nm and 240 nm and a depth of between 5 μm and 20 μm, and the necking point protrudes within the via by between 100 nm and 120 nm at a height from the bottom of the via of between 800 nm and 1.2 μm.

3. The method of claim 1, wherein:

the metal fill material comprises tungsten (W) or molybdenum (Mo), the liner layer comprises titanium nitride (TiN), and the dielectric layer comprises silicon oxide ($SiO_2$), silicon nitride ($Si_3N_4$), silicon oxynitride ($SiO_xN_y$), hafnium containing material, zirconium containing material, aluminum-containing material, lanthanum-containing material, or a combination thereof.

4. The method of claim 1, where the pre-clean process comprises a chemical soak process in which the exposed surface of the metal layer is soaked in a precursor including tungsten fluoride ($WF_6$) or hydrogen ($H_2$) that is provided in a processing chamber.

5. The method of claim 1, wherein the pre-clean process comprises an inductively coupled plasma (ICP) process using a plasma formed from a process gas including hydrogen ($H_2$)-containing gas.

6. The method of claim 1, wherein the pre-clean process comprises a plasma treatment process using a plasma formed from a process gas including oxygen ($O_2$)-containing gas.

7. The method of claim 1, wherein the selective deposition process comprises a chemical vapor deposition (CVD) process using a tungsten (W)-containing precursor and a hydrogen ($H_2$)-containing carrier gas, at a flow rate ratio of the tungsten (W)-containing precursor to the hydrogen ($H_2$)-containing carrier gas of between 0.001 and 0.007.

8. The method of claim 1, wherein the metal fill process comprises a chemical vapor deposition (CVD) process using a tungsten (W)-containing precursor, a hydrogen ($H_2$)-containing carrier gas, and a nitrogen-containing gas.

9. A method of filling a via having a necking point, comprising:

performing a liner deposition process to form a liner layer on exposed inner surface of a via, wherein the via is formed within a dielectric layer and has a necking point protruding within the via;

performing a liner pull back process to remove the liner layer above the necking point;

performing a selective deposition process to partially fill the via with metal fill material from exposed surface of the liner layer below the necking point; and performing a metal fill process to fill the via with the metal fill material.

10. The method of claim 9, wherein the metal fill material comprises tungsten (W) or molybdenum (Mo), the liner layer comprises titanium nitride (TiN), and the dielectric layer comprises silicon oxide ($SiO_2$), silicon nitride ($Si_3N_4$), silicon oxynitride ($SiO_xN_y$), hafnium containing material, zirconium containing material, aluminum-containing material, lanthanum-containing material, or a combination thereof.

11. The method of claim 9, further comprising:

prior to the selective deposition process, performing a pre-clean process to recover inner surfaces of the via.

12. The method of claim 11, wherein the pre-clean process comprises a plasma treatment process using a plasma formed from a process gas including oxygen ($O_2$)-containing gas.

13. The method of claim 9, wherein the selective deposition process comprises a chemical vapor deposition (CVD) process using a tungsten (W)-containing precursor and a hydrogen ($H_2$)-containing carrier gas, at a flow rate ratio of the tungsten (W)-containing precursor to the hydrogen ($H_2$)-containing carrier gas of between 0.001 and about 0.007.

14. The method of claim 9, wherein the metal fill process comprises a chemical vapor deposition (CVD) process using a tungsten (W)-containing precursor, a hydrogen ($H_2$)-containing carrier gas, and a nitrogen-containing gas.

15. A method of filling a via having a necking point, comprising:

performing a liner deposition process to form a liner layer on exposed inner surface of a via, wherein the via is formed within a dielectric layer and has a necking point protruding within the via;

performing a liner pull back process to remove the liner layer above the necking point;

performing a fluorine-free tungsten (FFW) growth process to form a metal capping layer selectively on exposed surfaces of the liner layer;

performing a selective deposition process to partially fill the via with metal fill material from exposed surface of the metal capping layer below the necking point; and performing a metal fill process to fill the via with the metal fill material.

16. The method of claim 15, wherein the metal fill material comprises tungsten (W) or molybdenum (Mo), the liner layer comprises titanium nitride (TiN), and the dielectric layer comprises silicon oxide ($SiO_2$), silicon nitride ($Si_3N_4$), silicon oxynitride ($SiO_xN_y$), hafnium containing material, zirconium containing material, aluminum-containing material, lanthanum-containing material, or a combination thereof.

17. The method of claim 15, further comprising:

prior to the selective deposition process, performing a pre-clean process to recover inner surfaces of the via.

18. The method of claim 17, wherein the pre-clean process comprises a plasma treatment process using a plasma formed from a process gas including oxygen ($O_2$)-containing gas.

19. The method of claim 15, wherein the selective deposition process comprises a chemical vapor deposition (CVD) process using a tungsten (W)-containing precursor and a hydrogen ($H_2$)-containing carrier gas, at a flow rate ratio of the tungsten (W)-containing precursor to the hydrogen ($H_2$)-containing carrier gas of between 0.001 and 0.007.

20. The method of claim 15, wherein the metal fill process comprises a chemical vapor deposition (CVD) process using a tungsten (W)-containing precursor, a hydrogen ($H_2$)-containing carrier gas, and a nitrogen-containing gas.

* * * * *